(12) United States Patent
Lee

(10) Patent No.: US 6,265,908 B1
(45) Date of Patent: Jul. 24, 2001

(54) LOW VOLTAGE BALUN CIRCUIT

(75) Inventor: Sang Gug Lee, Taejon (KR)

(73) Assignee: Information and Communications University, Taejon (KR)

( * ) Notice: Subject to any disclaimer, the term of this patent is extended or adjusted under 35 U.S.C. 154(b) by 0 days.

(21) Appl. No.: 09/461,596

(22) Filed: Dec. 15, 1999

(30) Foreign Application Priority Data

Aug. 13, 1999 (KR) .................................................. 99-33267

(51) Int. Cl.[7] .................................................. H03K 5/22
(52) U.S. Cl. .............................................. 327/77; 327/65
(58) Field of Search .............................. 327/63, 65, 66, 327/77, 52, 53, 56, 333, 560–563; 330/252, 261

(56) References Cited

U.S. PATENT DOCUMENTS

| | | | |
|---|---|---|---|
| 5,430,337 | * | 7/1995 | Castella et al. .................... 327/65 |
| 6,011,431 | * | 1/2000 | Gilbert .................................. 327/563 |
| 6,069,522 | * | 5/2000 | Venkatraman et al. ................ 327/65 |
| 6,100,759 | * | 8/2000 | Sirna et al. ........................... 330/252 |

* cited by examiner

Primary Examiner—Toan Tran
(74) Attorney, Agent, or Firm—Rosenman & Colin, LLP

(57) ABSTRACT

A balun circuit capable of operating at low voltages comprises a set of a load resistor, a first and a second transistors connected in series in that order between a supply voltage source and the ground and another set of a load resistor, a third and a fourth transistors connected in series in that order between the supply voltage source and the ground. The emitters of the first and the third transistors are connected to the collectors of the second and the fourth transistors, respectively. The balun circuit further comprises a bias voltage source connected to the bases of the first and the third transistors; a bias current source connected to the bases of the second and the fourth transistors; a first capacitor; an input voltage source coupled to the collector of the second transistor via the first capacitor; and a second capacitor coupled between the base and the collector of the second transistor.

8 Claims, 2 Drawing Sheets

LOW VOLTAGE BALUN CIRCUIT

FIELD OF THE INVENTION

The present invention relates to an analog integrated circuit; and, more particularly, to a balun circuit capable of operating at a low bias voltage.

DESCRIPTION OF THE PRIOR ART

A balun circuit is used in commercial applications such as cellular telephones, high definition television and other circuits, which receives a single-ended input signal to generate an amplified differential signal with 180° of phase difference. Such circuit should also operate at a low direct current (DC) voltage typically less than 3 volts. Balun circuits employed in devices utilizing batteries also require low DC power consumption to maximize battery life.

Referring to FIG. 1, there is shown an exemplary conventional balun circuit which includes load resistors $R_{L1}$ and $R_{L2}$ coupled to a supply voltage $V_{CC}$ and collectors of two NPN bipolar transistors Q1 and Q2, respectively, a single-ended small-signal input voltage $V_i$ connected to the base of the bipolar transistor Q1, a bias current source $I_{BIAS}$ commonly coupled to both emitters of the bipolar transistors Q1 and Q2, and a voltage source $V_{EE}$ coupled to the current source $I_{BIAS}$, wherein the base of the bipolar transistor Q2 is grounded.

In the circuit shown in FIG. 1, a differential output voltage $V_o$ is generated between the collectors of the bipolar transistors Q1 and Q2. In such a circuit, however, an operating current value is fixed by the current source $I_{BIAS}$, resulting in poor linearity of the circuit characteristics. Further, if an output impedance of the bias current source $I_{BIAS}$ is low, a symmetry characteristic of the output voltage signal becomes deteriorated, especially at high frequencies.

FIG. 2 shows another exemplary conventional balun circuit which further includes two NPN bipolar transistors Q3 and Q4, a bias voltage $V_{BIAS}$ and a capacitor C1. In the circuit of FIG. 2, the collectors of the transistor Q3 and Q4 are connected to the resistors $R_{L1}$ and $R_{L2}$ and the emitters thereof are coupled to the collectors of the transistors Q1 and Q2. The transistors Q1 and Q3 construct a cascode circuit. The capacitor C1 positioned between the collector of the bipolar transistor Q2 and the input voltage $V_i$ serves to block DC components from the input voltage $V_i$. Coupled to the bases of transistors Q3 and Q4 is the bias voltage source $V_{BIAS}$. Coupled to the bases of the transistors Q1 and Q2 is the bias current source $I_{BIAS}$. At the transistor Q2, the base and the collector are diode-connected. Specifically, the bias voltage source $V_{BIAS}$ represents a bias circuit for providing enough voltage to activate the transistors Q1 to Q4 in a forward-active mode and small signal ground to the bases of the transistors Q3 and Q4. The bias current source $I_{BIAS}$ represents a bias circuit for biasing the transistors Q1 and Q2 while imposing minimal loading effect thereon.

In the circuit shown in FIG. 2, the input transistors Q1 and Q4 function as class-AB amplifiers with the increasing input signal $V_i$, resulting in improved linear characteristics over those of the circuit in FIG. 1. The circuit of FIG. 2 is also advantageous in that an improved symmetry characteristic can be obtained at high frequencies because it does not require the bias current source $I_{BIAS}$ connected to the emitters of the transistors Q1 and Q2 as in the circuit of FIG. 1.

However, the conventional balun circuit shown in FIG. 2 has a drawback in that it requires a substantially large supply voltage. In other words, the bias voltage $V_{BIAS}$ in the circuit of FIG. 2 is to be set to $2*V_{BE}$, thereby limiting a lower bound of the supply voltage. For example, in case of a balun circuit incorporating therein GaAs hetro-junction bipolar transistors (HBTs), a bias voltage $V_{BIAS}$ is required to be about 3V. Such a balun circuit therefore may not be suitable to be used with a circuit having a supply voltage of 2V. Further, a DC value of the output voltage need be greater with increasing $V_{BIAS}$, preventing direct coupling between the balun circuit and an external circuit to be connected thereto or causing the range of the output voltage to be reduced.

SUMMARY OF THE INVENTION

It is, therefore, a primary object of this invention to provide a balun circuit which is capable of operating at lower supply voltages.

In accordance with a preferred embodiment of the present invention, there is provided a balun circuit, comprising:

a set of a first load element, a first device and a second device connected in series in that order between a supply voltage source and the ground;

a set of second load element, a third device and a fourth device connected in series in that order between the supply voltage source and the ground, wherein each of the first to fourth devices has a control electrode and a first and a second electrodes, the first electrode of the first and the third devices being connected the second electrodes of the second and the fourth devices, respectively;

a bias voltage source connected to the control electrodes of the first and the third devices;

a bias current source connected to the control electrodes of the second and the fourth devices;

a first capacitor;

an input voltage source coupled to the second electrode of the second device via the first capacitor; and a second capacitor coupled between the control electrode and the second electrode of the second device which is capable of operating at lower supply voltages.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENT

Figure 1:
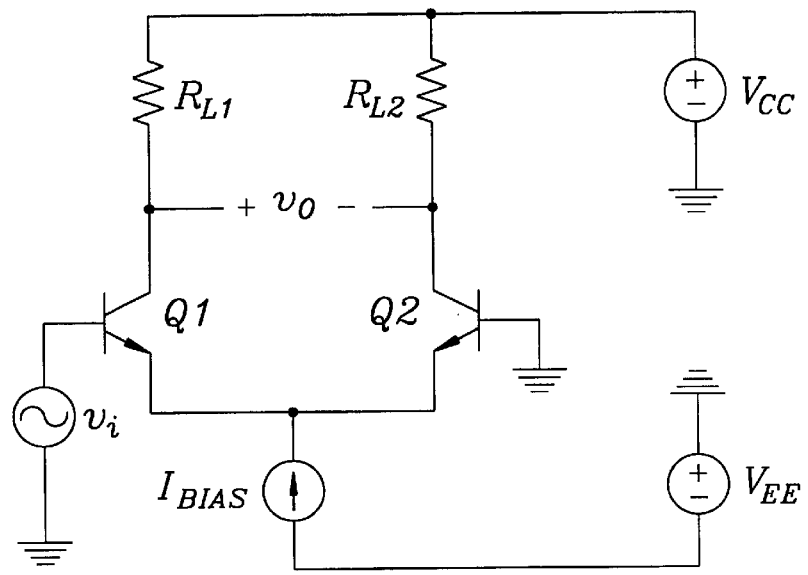
FIG. 1 shows a circuit diagram depicting a conventional balun circuit.
Figure 2:
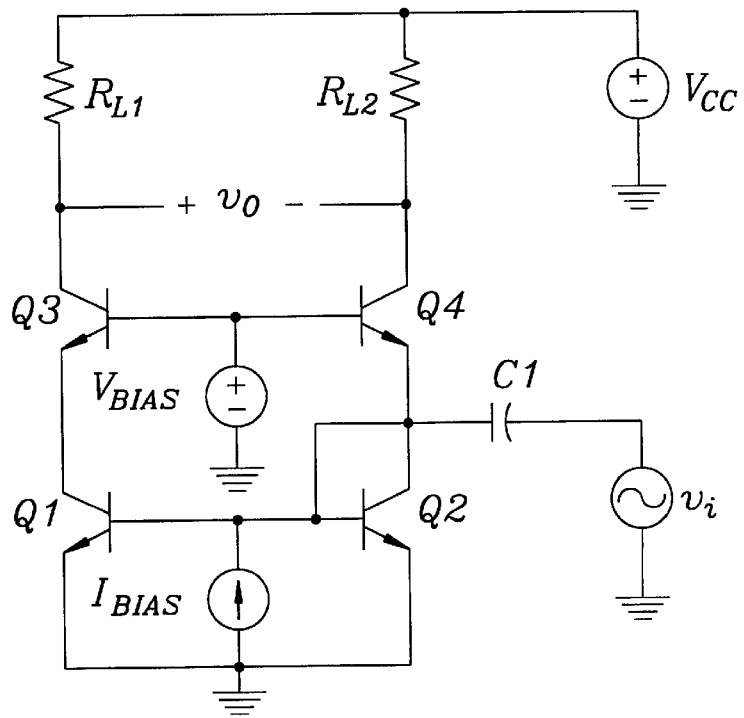
FIG. 2 offers a circuit diagram depicting another conventional balun circuit.
Figure 3:
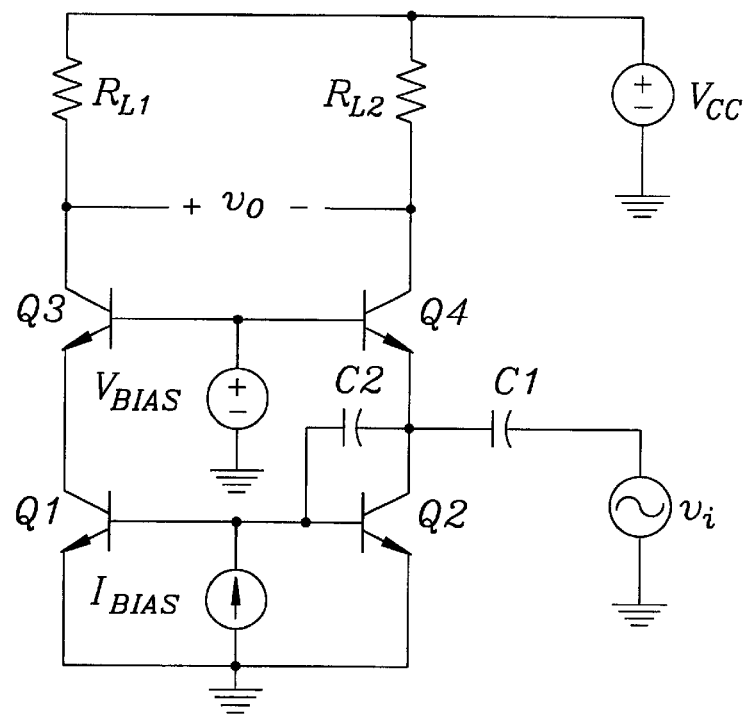
FIG. 3 represents a circuit diagram of a low voltage balun circuit in accordance with a preferred embodiment of the present invention.

With reference to FIG. 3, there is illustrated a low voltage balun circuit in accordance with a preferred embodiment of the present invention, wherein reference characters from FIG. 2 will be used where appropriate.

The structure of the inventive balun circuit shown in FIG. 3 is identical to that of FIG. 2 except that a capacitor $C_2$ are further provided thereto. The capacitor $C_2$ is a coupling capacitor disposed between the base and the collector of the transistor Q2 and serves to block DC components which may be fed to the base of the transistor Q2 from the collector of the transistor Q2.

In FIG. 3, the bias current $I_{BIAS}$ serves to turn on the input transistors Q1 and Q2. The bias voltage $V_{BIAS}$ is used to turn on the output transistors Q3 and Q4 and provides a voltage allowing the transistors Q1 and Q2 to operate in a forward-active region. The capacitor $C_1$ blocks DC components between the small signal input voltage Vi and the collector of the transistor Q2. The function of the capacitor $C_2$ is to provide an AC short-circuit between the collector and the base of the transistor Q2.

For the input voltage $V_i$, the transistor Q4 constructs a common-base configuration to generate an output voltage signal in-phased with the input voltage signal $V_i$. The transistors Q1 to Q3 construct a cascode circuit with a current mirror configuration to generate an output voltage having a phase 180° shifted from that of the input voltage signal $V_i$.

If the impedances of the load resistors $R_{L1}$, $R_{L2}$ are sufficiently smaller than those of the common-base circuit and the cascode circuit, and if a phase difference between the base and collector of the transistor Q1 is in the proximity of 180°, virtually ideal differential voltage signal will be generated from the balun circuit of the present invention.

As described above, both the input transistors Q1 and Q4 operate in the class-AB fashion as the magnitude of the input voltage signal $V_i$ increases, thereby resulting in improved linear characteristics being generated from the balun circuit.

In accordance with the present invention, the collector of the transistor Q2 is not diode-connected to the base thereof as in FIG. 2 but connected thereto via the capacitor $C_2$, thereby preventing the base-emitter voltage from being identical to the collector-emitter voltage and also allowing AC and DC components to be separated. By forward-biasing the collector-base junctions within a range allowing the transistors Q1 and Q2 not to operate in the saturation region, the balun circuit shown in FIG. 3 can be operable at lower supply voltages.

In accordance with the present invention, a balun circuit incorporating therein CMOS devices having high threshold voltages or GaAs HBTs can operate at voltages less than, for example, 3V.

Note that, when deciding the collector-emitter voltages of the transistors Q1 and Q2 in FIG. 3, a small amount of voltage allowance should be considered to accommodate the variation of the magnitude of the input voltage signal $V_i$ in order to prevent the input transistors Q1 and Q2, especially Q2, from being operated in the saturation region. However, the variation of the input voltage signal $V_i$ may not be a critical issue since the operating current decreases with decreasing input signal voltages, so does a collector-emitter saturation voltage.

It should be apparent to those skilled in the art that the NPN bipolar transistors Q1 to Q4 may be replaced with other types of transistors including, but not limited to, PNP bipolar transistors, N channel field effect transistors (FETs), and P channel FETs. Furthermore, the load resistors $R_{L1}$ and $R_{L2}$ used in the output stage may also be replaced with active load devices, for example, transistors.

Figure 4:
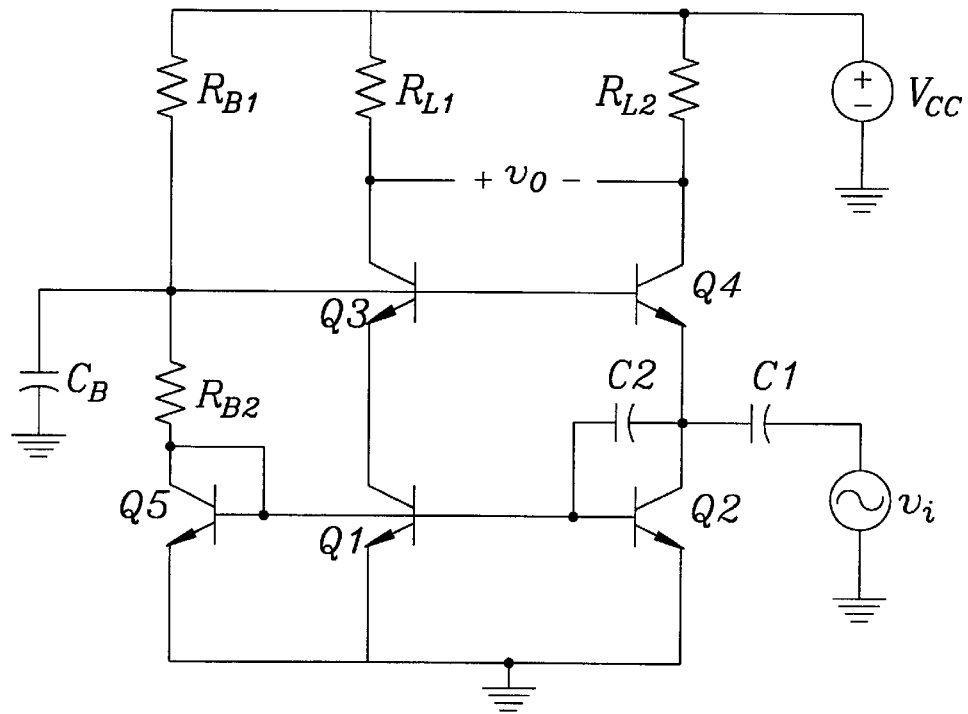
FIG. 4 is an exemplary implementation of the balun circuit shown in FIG. 3 in accordance with the preferred embodiment of the present invention.

FIG. 4 shows an exemplary implementation of the balun circuit shown in FIG. 3 in accordance with the preferred embodiment of the present invention.

As shown In FIG. 4, the bias voltage source $V_{BIAS}$ shown in FIG. 3 is replaced with a capacitor $C_B$ and two bias resistors $R_{B1}$ and $R_{B2}$ connected in a series to the supply voltage $V_{CC}$, the node between the resistors $R_{B1}$ and $R_{B2}$ being coupled to the ground through the capacitor $C_B$ and to the bases of the transistors Q3 and Q4. Also, The bias current source $I_{BIAS}$ shown in FIG. 3 is replaced with an NPN bipolar transistor Q5, wherein the collector and the base of the transistor Q5 is diode-connected and the collector of the transistor Q5 is also coupled to the bases of the input transistors Q1 and Q2. The bias resistor $R_{B2}$ is connected to the collector of the transistor Q5 and the emitter of the transistor Q5 is grounded. The NPN bipolar transistor Q5 may be replaced with a FET or a PNP transistor. One skilled in the prior art will recognize that the capacitor $C_B$ is responsible for reducing unwanted AC components contained in the supply voltage $V_{CC}$.

While the present invention has been described with reference to the particular embodiments, it will be apparent to those skilled in the art that various changes and modifications may be made without departing from the spirit and scope of the invention as defined in the following claims.

What is claimed is:

1. A balun circuit, comprising:

a set of a first load element, a first device and a second device connected in series in that order between a supply voltage source and the ground;

a set of second load element, a third device and a fourth device connected in series in that order between the supply voltage source and the ground, wherein each of the first to fourth devices has a control electrode and a first and a second electrodes, first electrodes of the first and the third devices being connected to second electrodes of the second and the fourth devices, respectively;

a bias voltage source connected to control electrodes of the first and the third devices;

a bias current source connected to control electrodes of the second and the fourth devices;

a first capacitor;

an input voltage source coupled to the second electrode of the second device via the first capacitor; and a second capacitor coupled between the control electrode and the second electrode of the second device.

2. The circuit according to claim 1, wherein the devices are PNP bipolar transistors.

3. The circuit according to claim 1, wherein the devices are N channel field effect transistors.

4. The circuit according to claim 1, wherein the devices are P channel field effect transistors.

5. The circuit according to claim 1, wherein the load elements are resistors.

6. The circuit according to claim 1, wherein the devices are NPN bipolar transistors.

7. The circuit according to claim 6, wherein the first and the second electrodes of each device are an emitter and a collector thereof.

8. The circuit according to claim 7, wherein the bias voltage source and the bias current source are implemented by a first and a second resistors and a fifth NPN bipolar transistor connected in series in that order between the supply voltage source and the ground, and a third capacitor coupled between the ground and a node between the first and the second resistors, the node being coupled to the control electrodes of the first and the third devices, a collector of the fifth NPN transistor being coupled to the second resistor, the collector and a base of the fifth NPN transisto being diode-connected, and the base being coupled to the control electrodes of the second and the fourth devices.

* * * * *